(12) United States Patent
Abe

(10) Patent No.: US 12,446,361 B2
(45) Date of Patent: Oct. 14, 2025

(54) LIGHT EMITTING ELEMENT

(71) Applicant: NICHIA CORPORATION, Anan (JP)

(72) Inventor: Makoto Abe, Tokushima (JP)

(73) Assignee: NICHIA CORPORATION, Anan (JP)

( * ) Notice: Subject to any disclaimer, the term of this patent is extended or adjusted under 35 U.S.C. 154(b) by 451 days.

(21) Appl. No.: 18/053,622

(22) Filed: Nov. 8, 2022

(65) Prior Publication Data

US 2023/0163240 A1     May 25, 2023

(30) Foreign Application Priority Data

Nov. 22, 2021   (JP) ................................ 2021-189304

(51) Int. Cl.
| | | |
|---|---|---|
| *H10H 20/816* | (2025.01) | |
| *H10H 20/812* | (2025.01) | |
| *H10H 20/813* | (2025.01) | |
| *H10H 20/825* | (2025.01) | |

(52) U.S. Cl.
CPC ...... *H10H 20/8162* (2025.01); *H10H 20/812* (2025.01); *H10H 20/8252* (2025.01); *H10H 20/813* (2025.01)

(58) Field of Classification Search
CPC ............... H10H 20/813; H10H 20/812; H10H 20/8252; H10H 20/825; H10H 20/8215; H10H 20/8162; H10H 20/816; H10H 20/811; H10H 20/8131; H10H 20/6252
See application file for complete search history.

(56) References Cited

U.S. PATENT DOCUMENTS

| | | | |
|---|---|---|---|
| 2004/0066816 A1 | 4/2004 | Collins et al. | |
| 2010/0059734 A1 | 3/2010 | Kaneko et al. | |
| 2012/0126201 A1 | 5/2012 | Liu | |
| 2013/0069032 A1* | 3/2013 | Kushibe | H10H 20/825 438/47 |
| 2014/0048771 A1 | 2/2014 | Takahashi et al. | |
| 2015/0060877 A1* | 3/2015 | Liu | H10H 20/813 257/76 |
| 2018/0342646 A1* | 11/2018 | Uzawa | H10H 20/812 |

(Continued)

FOREIGN PATENT DOCUMENTS

| | | |
|---|---|---|
| JP | 2004-128502 A | 4/2004 |
| JP | 2010-067709 A | 3/2010 |

(Continued)

*Primary Examiner* — Moazzam Hossain
(74) *Attorney, Agent, or Firm* — Foley & Lardner LLP

(57) ABSTRACT

A light emitting element includes, successively from a lower side to an upper side, a first light emitting part having a first active layer, a tunnel junction part, and a second light emitting part having a second active layer. The first active layer includes a plurality of first well layers, and a first barrier layer positioned between two adjacent first well layers among the first well layers. The second active layer includes a plurality of second well layers, and a second barrier layer positioned between two adjacent second well layers among the second well layers. The second barrier layer is a nitride semiconductor layer containing an n-type impurity and gallium, and has an n-type impurity concentration higher than that of the first barrier layer. An n-type impurity concentration peak in the second barrier layer is located on a first light emitting part side.

14 Claims, 5 Drawing Sheets

(56) References Cited

U.S. PATENT DOCUMENTS

2021/0202790 A1 7/2021 Hayashi
2021/0305451 A1 9/2021 Kishino

FOREIGN PATENT DOCUMENTS

| JP | 2017-157667 A | 9/2017 |
| JP | 2018-201009 A | 12/2018 |
| JP | 2021-106245 A | 7/2021 |
| JP | 2021-158291 A | 10/2021 |
| WO | WO-2013/132812 A1 | 9/2013 |

* cited by examiner

LIGHT EMITTING ELEMENT

CROSS-REFERENCE TO RELATED APPLICATIONS

This application is based upon and claims priority to Japanese Patent Application No. 2021-189304, filed on Nov. 22, 2021, the entire contents of which are incorporated herein by reference.

FIELD

The present disclosure relates to a light emitting element.

BACKGROUND

Japanese Patent Publication No. 2017-157667, for example, discloses a light emitting element comprising nitride semiconductor layers that include a tunnel junction layer.

SUMMARY

There is a desire to improve the emission efficiency of such a light emitting element. An object of certain embodiments of the present disclosure is to provide a light emitting element that can increase the emission efficiency.

According to one embodiment of the present disclosure, a light emitting element has, successively from the lower side to the upper side, a first light emitting part having a first active layer, a tunnel junction part, and a second light emitting part having a second active layer. The first active layer has a plurality of first well layers and a first barrier layer positioned between two adjacent first well layers among the first well layers and having a wider band gap than the band gaps of the first well layers. The second active layer has a plurality of second well layers and a second barrier layer positioned between two adjacent second well layers among the second well layers and having a wider band gap than the band gaps of the second well layers, wherein the second barrier layer is a nitride semiconductor layer containing an n-type impurity and gallium, and having a higher n-type impurity concentration than the n-type impurity concentration of the first barrier layer, and the n-type impurity concentration peak in the second barrier layer is located on the first light emitting part side.

According to certain embodiments of the present disclosure, a light emitting element with improved emission efficiency can be provided.

DETAILED DESCRIPTION

Figure 1:
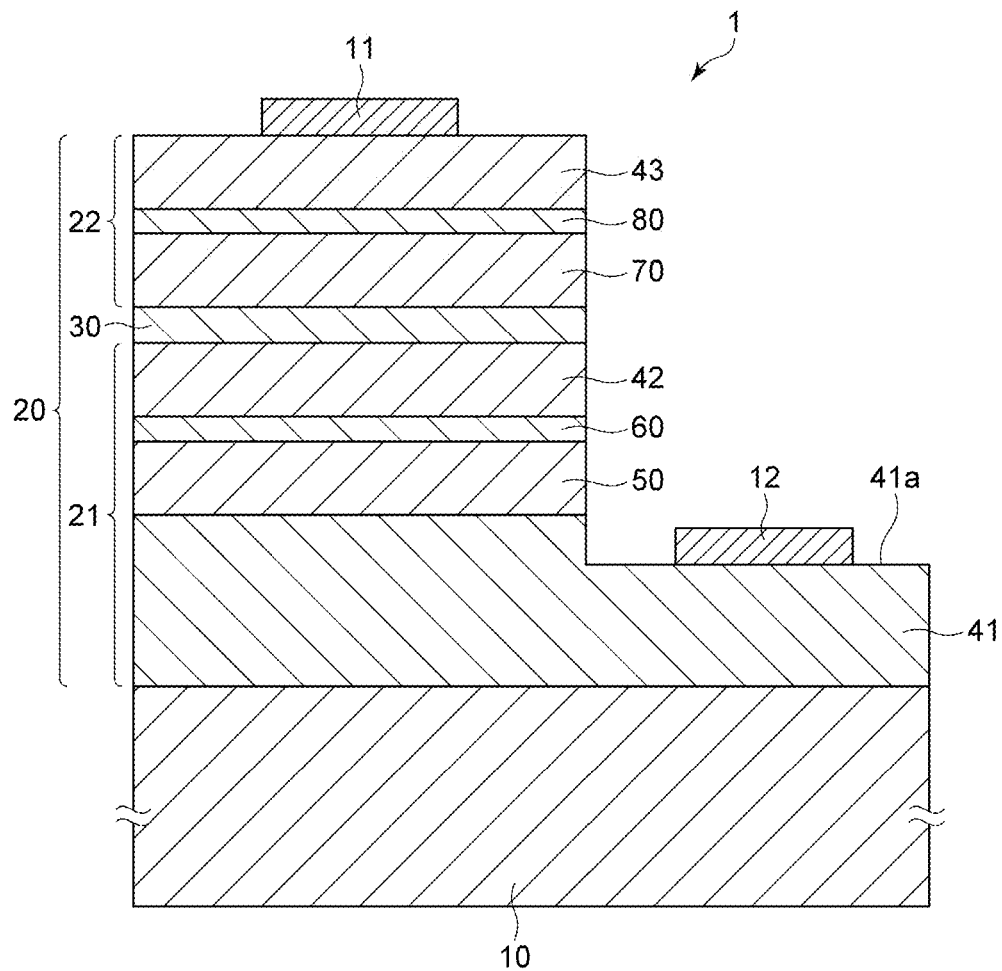
FIG. 1 is a cross-sectional view of a light emitting element according to an embodiment.

Certain embodiments of the present disclosure will be explained below with reference to the accompanying drawings. In the drawings, the same constituents are denoted by the same reference numerals. Each drawing is a schematic illustration of an embodiment. As such, the scale, spacing, or positional relationship of members might be exaggerated, or a portion of a member omitted. Furthermore, as a cross-sectional view, an end face view showing a cut cross section might be used.

FIG. 1 is a cross-sectional view of a light emitting element 1 according to an embodiment.

The light emitting element 1 has a substrate 10, a semiconductor stack structure 20, a p-side electrode 11, and an n-side electrode 12.

A substrate 10 supports a semiconductor stack structure 20. For the material for the substrate 10, for example, sapphire, silicon, SiC, GaN, or the like can be used. In the case of using a sapphire substrate as the substrate 10, the semiconductor stack structure 20 is deposited on the c-plane of the sapphire substrate.

A semiconductor stack structure 20 is a stacked structure in which a plurality of semiconductor layers made of nitride semiconductors are stacked. Nitride semiconductors can include all semiconductors obtained by varying the composition ratio x and y within their ranges in the chemical formula $In_xAl_yGa_{1-x-y}N$ ($0 \leq x \leq 1$, $0 \leq y \leq 1$, $x+y \leq 1$). For example, the semiconductor stack structure 20 is formed by epitaxially growing semiconductors on the substrate 10.

In the present specification, the lower side is closer to the substrate 10 relative to the upper side. The semiconductor stack structure 20 includes, successively from the lower side to the upper side, a first light emitting part 21, a tunnel junction part 30, and a second light emitting part 22.

A first light emitting part 21 has an n-side nitride semiconductor layer 41 positioned on the substrate 10, a first superlattice layer 50 positioned on the n-side nitride semiconductor layer 41, a first active layer 60 positioned on the first superlattice layer 50, and a first p-side nitride semiconductor layer 42 positioned on the first active layer 60.

A second light emitting part 22 has a second superlattice layer 70 positioned on a tunnel junction part 30, a second active layer 80 positioned on the second super lattice layer 70, and a second p-side nitride semiconductor layer 43 positioned on the second active layer 80.

An n-side nitride semiconductor layer 41 has an n-type layer containing an n-type impurity. The n-type layer contains, for example, silicon (Si) as the n-type impurity. Alternatively, the n-type layer may contain germanium (Ge) as the n-type impurity. The n-side semiconductor layer 41 is sufficient if it has the function of supplying electrons, and may include an undoped layer formed without intentionally doping with an n-type or p-type impurity. The undoped layer in the case of being adjacent to a layer intentionally doped with an n-type impurity and/or a p-type impurity might contain the n-type impurity and/or the p-type impurity through diffusion from the adjacent layer.

A first p-side nitride semiconductor layer 42 and a second p-side nitride semiconductor layer 43 each have a p-type layer containing a p-type impurity. Such a p-type layer contains, for example, magnesium (Mg) as the p-type impurity. The first p-side nitride semiconductor layer 42 and the second p-side nitride semiconductor layer 43 are sufficient if they have the function of supplying positive holes, and may include an undoped layer.

A first active layer 60 and a second active layer 80 have a multi-quantum well structure that includes a plurality of well layers and a plurality of barrier layers as described below. The first active layer 60 and the second active layer 80 can emit blue light or green light, for example. The peak emission wavelength of blue light is 430 nm to 490 nm. The peak emission wavelength of green light is 500 nm to 540 nm. The peak emission wavelength of the emitted light from the first active layer 60 may be the same as or different from that from the second active layer 80. The first active layer 60 and the second active layer 80 can emit light having a shorter peak emission wavelength than that of blue light or light having a longer peak emission wavelength than that of green light.

A tunnel junction part 30 includes a nitride semiconductor layer. The tunnel junction part 30 forms a tunnel junction with the first p-side nitride semiconductor layer 42. The tunnel junction part 30 has at least one semiconductor layer among p-type and n-type layers. A p-type layer is disposed in contact with the upper face of the first p-side nitride semiconductor layer 42, and contains, for example, magnesium as a p-type impurity. If a p-type layer is disposed, an n-type layer is disposed on the upper face of the p-type layer. If no p-type layer is disposed, the n-type layer is disposed in contact with the upper face of the first p-side nitride semiconductor layer 42. The n-type layer contains, for example, silicon as an n-type impurity.

A first superlattice layer 50 is positioned between the n-side nitride semiconductor layer 41 and the first active layer 60. A second superlattice layer 70 is positioned between the tunnel junction part 30 and the second active layer 80. Providing a first superlattice layer 50 and a second superlattice layer 70 can reduce the lattice mismatch between the substrate 10 and the semiconductor stack structure 20, thereby reducing crystal defects in the semiconductor stack structure 20.

The first superlattice layer 50 and the second superlattice layer 70 each have a plurality of first nitride semiconductor layers and a plurality of second nitride semiconductor layers. The first superlattice layer 50 and the second superlattice layer 70 can each have 15 to 25 pairs of a first nitride semiconductor layer and a second nitride semiconductor layer. The first superlattice layer 50 and the second superlattice layer 70 can each have, for example, twenty first nitride semiconductor layers and twenty second nitride semiconductor layers. In each of the first superlattice layer 50 and the second superlattice layer 70, a second nitride semiconductor layer is in the lowest position (the lowermost layer), and a first nitride semiconductor layer is in the highest position (the uppermost layer). From the second nitride semiconductor layer, the lowermost layer, to the first nitride semiconductor layer, the uppermost layer, the second nitride semiconductor layers and the first nitride semiconductor layers are formed alternately.

The composition of a first nitride semiconductor layer differs from the composition of a second nitride semiconductor layer. The first nitride semiconductor layers in the first superlattice layer 50 are, for example, undoped InGaN layers. The In composition ratio in the InGaN layers can be set in a range of 5% to 10%. The second nitride semiconductor layers in the first superlattice layer 50 are, for example, undoped GaN layers. The first nitride semiconductor layers in the second superlattice layer 70 are, for example, silicon-doped n-type InGaN layers. The In composition ratio in the InGaN layers can be set in a range of 5% to 10%. The second nitride semiconductor layers in the second superlattice layer 70 are, for example, silicon-doped n-type GaN layers. The n-type impurity concentration of the first nitride semiconductor layers and the second nitride semiconductor layers of the second superlattice layer 70 can be set, for example, in a range of $1\times10^{17}$ cm$^{-3}$ to $1\times10^{18}$ cm$^{-3}$. The n-type impurity concentration of each of the first nitride semiconductor layers and the second nitride semiconductor layers refers to the highest n-type impurity concentration among all concentrations in the respective first nitride semiconductor layers and the second nitride semiconductor layers.

In the first superlattice layer 50 and the second superlattice layer 70, the thicknesses of the first nitride semiconductor layers are smaller than the thicknesses of the second nitride semiconductor layers. For example, the thicknesses of the first nitride semiconductor layers can be set in a range of 0.5 nm to 1.5 nm. For example, the thicknesses the second nitride semiconductor layers can be set in a range of 1.5 nm to 3 nm.

The n-side nitride semiconductor layer 41 has an n-side contact face 41a on which no semiconductor layer is disposed. An n-side electrode 12 is disposed on the n-side contact face 41a. The n-side electrode 12 is electrically connected to the n-side nitride semiconductor layer 41.

A p-side electrode 11 is disposed on the upper face of the second p-side nitride semiconductor layer 43. The p-side electrode 11 is electrically connected to the second p-side nitride semiconductor layer 43.

A forward voltage is applied across the p-side electrode 11 and the n-side electrode 12. At this time, a forward voltage is applied across the second p-side nitride semiconductor layer 43 of the second light emitting part 22 and the n-side nitride semiconductor layer 41 of the first light emitting part 21, supplying positive holes and electrons to the first active layer 60 and the second active layer 80 thereby allowing the first active layer 60 and the second active layer 80 to emit light.

According to a light emitting element 1 of this embodiment, in which a second active layer 80 is provided above a first active layer 60, the per unit area output can be increased as compared to a light emitting element having a single active layer.

When a forward voltage is applied across the p-side electrode 11 and the n-side electrode 12, a reverse voltage would apply to the tunnel junction formed by the tunnel junction part 30 and the first p-side nitride semiconductor layer 42. Accordingly, allowing the p-type layer and the n-type layer that form the tunnel junction to respectively have high p-type and n-type impurity concentrations can narrow the width of the depletion layer formed by the junction of the tunnel junction part 30 and the first p-side nitride semiconductor layer 42. This allows for the tunneling of the electrons present in the valence band in the p-type layer to the conduction band of the n-type layer to thereby facilitate the electric current flow to the tunnel junction part 30.

The first active layer 60 and the second active layer 80 will be explained in detail below.

First Active Layer

Figure 2:
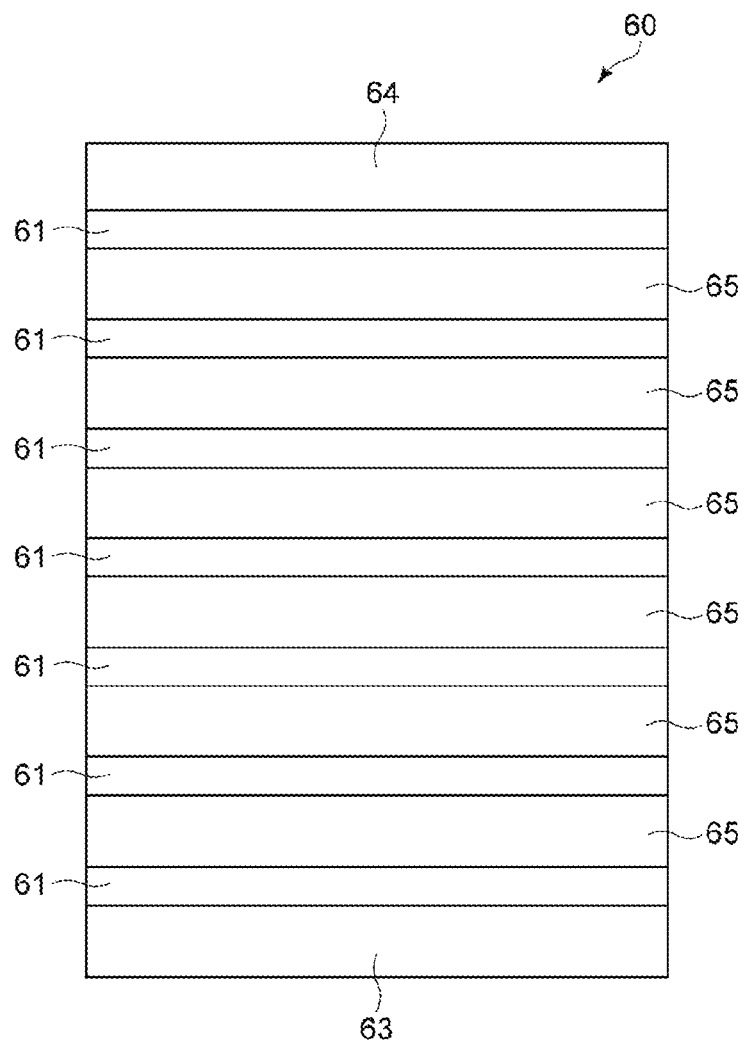
FIG. 2 is a cross-sectional view of a first active layer of the embodiment.

As shown in FIG. 2, the first active layer 60 has a plurality of first well layers 61 and at least one first barrier layer 65. The first active layer 60 has, for example, three or more first well layers 61 and two or more first barrier layers 65. The first active layer 60 can have, for example, seven first well layers 61 and six first barrier layers 65. Each first barrier layer 65 is positioned between two adjacent first well layers 61 among the first well layers 61. The active layer 60 can further have a fourth barrier layer 63 in the lowest position in the first active layer 60 and a fifth barrier layer 64 in the highest position in the first active layer 60. A first well layer 61 is disposed between the fourth barrier layer 63 and the first barrier layer 65 that has the lowest position among the first barrier layers 65. A first well layer 61 is disposed between the fifth barrier layer 64 and the first barrier layer 65 that has the highest position among the first barrier layers 65. Between the fourth barrier layer 63 and the fifth barrier layer 64, the first well layers 61 and the first barrier layers 65 are alternately provided.

The band gaps of the first barrier layers 65, the fourth barrier layer 63, and the fifth barrier layer 64 are wider than the band gaps of the first well layers 61. The first well layers 61, the first barrier layers 65, the fourth barrier layer 63, and the fifth barrier layer 64 are nitride semiconductor layers containing gallium. The first well layers 61 contain gallium and indium. For example, the first well layers 61 are undoped InGaN layers. In a case in which the first well layers 61 are InGaN layers, the In composition ratio can be set in a range of 12% to 18%. The first well layers 61 may contain aluminum. The first barrier layers 65 and the fifth barrier layer 64 are, for example, undoped GaN layers. The n-type impurity concentration of the first barrier layers 65 can be set, for example, in a range of $1 \times 10^{17}$ cm$^{-3}$. The fourth barrier layer 63 is, for example, an n-type GaN layer. The fourth barrier layer 63 contains silicon or germanium as the n-type impurity.

The thicknesses the first barrier layers 65 and the fifth barrier layer 64 are larger than the thicknesses of the first well layer 61. For example, the thicknesses of the first well layers 61 can be set in a range of 2.5 nm to 4 nm. For example, the thicknesses of the first barrier layers 65 and the fifth barrier layer 64 can be set in a range of 3 nm to 5 nm. The thickness of the fourth barrier layer 63 can be set in a range of 3 nm to 5 nm.

Second Active Layer

Figure 3:
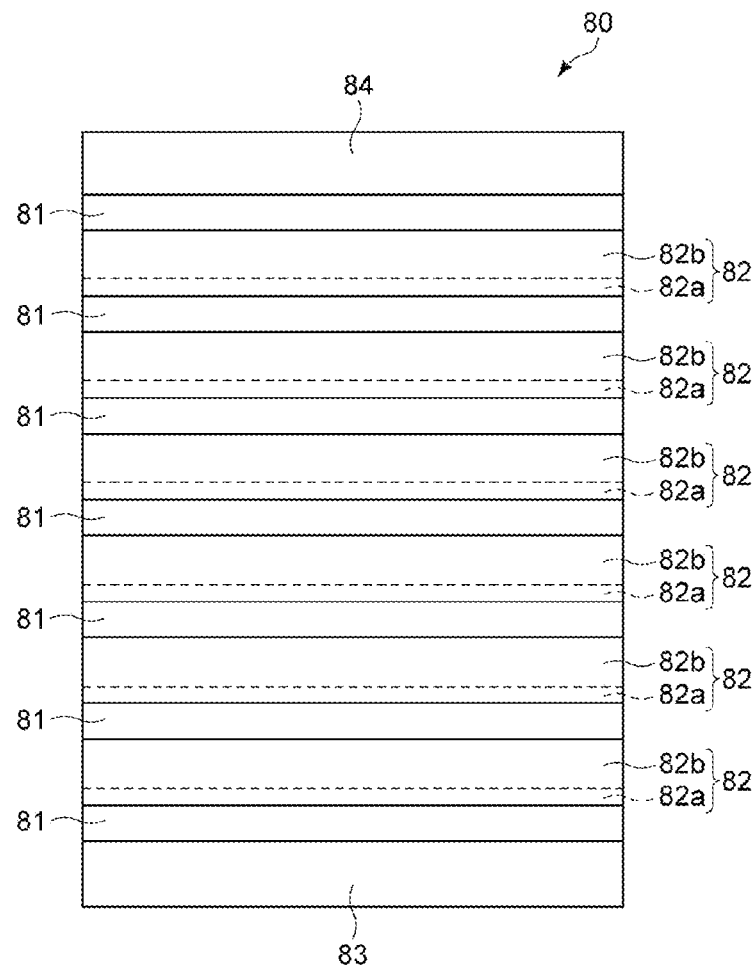
FIG. 3 is a cross-sectional view of a second active layer of the embodiment.

As shown in FIG. 3, the second active layer 80 has a plurality of second well layers 81 and at least one second barrier layer 82. The second active layer 80 has, for example, three or more second well layers 81 and two or more second barrier layers 82. The second active layer 80 can have, for example, seven second well layers 81 and six second barrier layers 82. Each second barrier layer 82 is positioned between two adjacent second well layers 81 among the second well layers 81.

Furthermore, the second active layer 80 can have a sixth barrier layer 83 in the lowest position in the second active layer 80 and a third barrier layer 84 in the highest position in the second active layer 80. A second well layer 81 is disposed between the sixth barrier layer 83 and the second barrier layer 82 that has the lowest position among the second barrier layers 82. A second well layer 81 is disposed between the third barrier layer 84 and the second barrier layer 82 that has the highest position among the second barrier layers 82. Between the sixth barrier layer 83 and the third barrier layer 84, the second well layers 81 and the second barrier layers 82 are alternately provided.

The band gaps of the second barrier layers 82, the sixth barrier layer 83, and the third barrier layer 84 are wider than the band gaps of the second well layers 81. The second well layers 81, the second barrier layers 82, the sixth barrier layer 83 and the third barrier layer 84 are nitride semiconductor layers containing gallium.

The second well layers 81 can contain gallium and indium. The second well layers 81 are, for example, undoped InGaN layers. In a case in which the second well layers 81 are InGaN layers, the In composition ratio can be set in a range of 12% to 18%. The second well layers 81 may contain aluminum.

The second barrier layers 82 contain an n-type impurity and gallium. The second barrier layers 82 contain, for example, silicon or germanium as the n-type impurity. The n-type impurity concentration of the second barrier layers 82 is higher than the n-type impurity concentration of the first barrier layers 65. The n-type impurity concentration peak in at least one of the second barrier layers 82 is located on the first light emitting part 21 side. The n-type impurity concentration peak is preferably located on the first light emitting part 21 side in all second barrier layers 82.

At least one of the second barrier layers 82 has a first layer 82a and a second layer 82b in that order from the first light emitting part 21 side. Every one of the second barrier layers 82 preferably has a first layer 82a and a second layer 82b. A second barrier layer 82 that includes both a first layer 82a and second layer 82b can be formed by forming a first layer 82a, followed by forming a second layer 82b on the first layer 82a. For example, a second barrier layer 82 can be formed by forming an n-type GaN layer as a first layer 82a, followed by forming on the first layer 82a an undoped GaN layer as a second layer 82b.

The n-type impurity concentration of a first layer 82a is higher than the n-type impurity concentration of a second layer 82b. The n-type impurity concentration peak in a second barrier layer 82 is positioned in the first layer 82a. The n-type impurity concentration of a first layer 82a is lower than the n-type impurity concentration of the tunnel junction part 30. The n-type impurity concentration of a first layer 82a is lower than the n-type impurity concentration of the second superlattice layer 70. The n-type impurity concentration of a first layer 82a can be set, for example, in a range of $2 \times 10^{18}$ cm$^{-3}$ to $5 \times 10^{18}$ cm$^{-3}$. The n-type impurity concentration of the tunnel junction part 30 can be set in a range of $1 \times 10^{20}$ cm$^{-3}$ to $5 \times 10^{21}$ cm$^{-3}$. The n-type impurity concentration of the second superlattice layer 70 can be set in a range of $1 \times 10^{19}$ cm$^{-3}$ to $1 \times 10^{20}$ cm$^{-3}$. Furthermore, the n-type impurity concentration of a first layer 82n is preferably higher than the p-type impurity concentration of the second barrier layer 82. This can prevent the second active layer 80 of the second light emitting part 22 described below from turning into a p-type layer. The n-type impurity concentration of a first layer 82a refers to the highest n-type concentration in the first layer 82a. The p-type impurity concentration of a second barrier layer 82 refers to the highest p-type concentration in the second barrier layer 82.

The n-type impurity concentration of the third barrier layer 84 is lower than the n-type impurity concentration in the second barrier layers 82. The third barrier layer 84 is, for example, an undoped GaN layer. The sixth barrier layer 83 is, for example, an n-type GaN layer. The sixth barrier layer 83 contains silicon or germanium as an n-type impurity. The n-type impurity concentration of the third barrier layer 84 refers to the highest n-type impurity concentration in the third barrier layer 84.

The thicknesses of the second barrier layers 82 and the third barrier layer 84 are larger than the thicknesses of the second well layers 81. For example, the thicknesses of the second well layers 81 can be set in a range of 2.5 nm to 4 nm. For example, the thicknesses of the second barrier layers 82 and the third barrier layer can be set in a range of 3 nm to 5 nm. The thickness of the sixth barrier layer 83 can be set in a range of 3 nm to 5 nm.

It is preferable to set the thickness of a first layer 82a in each second barrier layer 82 as 10% to 50%, more preferably 10% to 25% of the thickness of the second barrier layer 82. Setting the thickness of a first layer 82a in each second barrier layer 82 as 10% to 50% of the thickness of the second barrier layer 82 can readily increase the light output while reducing the forward voltage of the light emitting element. The thickness of a first layer 82a is preferably set to fall within the 0.5 nm to 2 nm range, for example, more preferably the 0.5 nm to 1 nm range.

In a light emitting element in which a second light emitting part is formed on a first light emitting part via a tunnel junction part, for example, the p-type impurity (e.g., magnesium) contained in the first p-side nitride semiconductor layer might diffuse into the second light emitting part during the formation of the second light emitting part on the tunnel junction part. If the p-type impurity is diffused into the second light emitting part, the second active layer of the second light emitting part would unintentionally turn into p-type to thereby increase the forward voltage of the light emitting element. This, as a result, reduces the emission efficiency of the light emitting element.

According to this embodiment, the second barrier layers 82 in the second active layer 80 of the second light emitting part 22 contain a higher concentration n-type impurity than the first barrier layers 65 of the first active layer 60 of the first light emitting part, and the n-type impurity concentration peaks in the second barrier layers 82 are located on the first light emitting part 21 side. This can reduce the turning of the second active layer 80 into p-type attributable to the diffusion of the p-type impurity from the first p-side nitride semiconductor layer 42. This, as a result, can increase the electron injection efficiency into the second light emitting part 22 thereby increasing the internal quantum efficiency. This can reduce the forward voltage thereby increasing the emission efficiency.

Making the n-type impurity concentration of the first barrier layers 65 in the first active layer 60 relatively high in the first light emitting part 21 does not tend to lead to the improvement in the emission efficiency of the light emitting element 1. This is because the p-type impurity contained in the first p-side nitride semiconductor layer 42 readily diffuses into the second light emitting part 22, i.e., it is unlikely for the first active layer 60 in the first light emitting part 21 to unintentionally turn into p-type.

Furthermore, if the n-type impurity concentration peak in a second barrier layer 82 is located on the second p-side nitride semiconductor layer 43 side instead of being on the first light emitting part 21 side, the n-type impurity might be unintentionally mixed into the second well layers 81 formed on the second barrier layers 82 to degrade the crystalline quality. According to this embodiment, the n-type impurity concentration peak in each second barrier layer 82 is positioned on the first light emitting part 21 side to thereby maintain the crystalline quality of the second well layers 81 while preventing the second active layer 80 from turning into p-type. As a result, a light emitting element with improved emission efficiency can be provided.

Next, the forward voltage and light output measurement results of the samples of the light emitting element 1 according to this embodiment will be explained.

Each of the light emitting element 1 samples produced had the constituents described below.

The substrate 10 was a sapphire substrate.

The n-side nitride semiconductor layer 41 contained silicon as a n-type impurity. The silicon concentration of the n-side nitride semiconductor layer 41 was about $1\times10^{19}$ $cm^{-3}$. The silicon concentration of the n-side nitride semiconductor layer 41 refers to the highest silicon concentration in the n-side nitride semiconductor layer 41. The thickness of the n-side nitride semiconductor layer 41 was about 5 µm.

The first superlattice layer 50 had twenty undoped InGaN layers and twenty undoped GaN layers. In the first superlattice layer 50, a GaN layer was in the lowest position (the lowermost layer), and an InGaN layer was in the highest position (the uppermost layer). GaN layers and InGaN layers were alternately disposed from the GaN layer that was the lowermost layer to the InGaN layer that was the uppermost layer. The In composition ratio of each InGaN layer was about 7%. The thickness of each InGaN layer was about 1 nm. The thickness of each GaN layer was about 2 nm.

The first active layer 60 had seven first well layers 61 and six first barrier layers 65. The first active layer 60 further had a fourth barrier layer 63 positioned lowest in the first active layer 60, and a fifth barrier layer 64 positioned highest in the first active layer 60. The first well layers 61 were undoped InGaN layers. The In composition ratio of the first well layers 61 was about 15%. The thickness of each first well layer 61 was about 3.5 nm. The first barrier layers 65 were undoped GaN layers. The thickness of each first barrier layer 65 was about 4 nm. The fourth barrier layer 63 included, successively from the first superlattice layer 50 side, a silicon-doped InGaN layer and an undoped GaN layer. The thickness of the fourth barrier layer 63 was about 3.5 nm. The fifth barrier layer 64 was an undoped GaN layer. The thickness of the fifth barrier layer 64 was about 4 nm.

The first p-side nitride semiconductor layer 42 contained magnesium as a p-type impurity. The magnesium concentration of the first p-side nitride semiconductor 42 was about $5\times10^{20}$ $cm^{-3}$. The magnesium concentration of the first p-side nitride semiconductor 42 refers to the highest magnesium concentration in the first p-side nitride semiconductor 42. The thickness of the first p-side nitride semiconductor 42 was about 80 nm.

The tunnel junction part 30 included, successively from the first p-side nitride semiconductor 42 side, a magnesium-doped p-type GaN layer and a silicon-doped n-type GaN layer. The silicon concentration of the n-type GaN layer was about $5\times10^{20}$ $cm^{-3}$. The thickness of the n-type GaN layer was about 150 nm.

The second superlattice layer 70 had twenty silicon-doped InGaN layers and twenty silicon-doped GaN layers. In the second superlattice layer 70, a GaN layer was in the lowest position (the lowermost layer) and an InGaN layer was in the highest position (the uppermost layer). GaN layers and InGaN layers were alternately disposed from the GaN layer that was the lowermost layer to the InGaN layer that was the uppermost layer. The In composition ratio of each InGaN layer was about 7%. The thickness of each InGaN layer was about 1 nm. The thickness of each GaN layer was about 2 nm. The silicon concentration of the InGaN and GaN layers was about $1\times10^{19}$ $cm^{-3}$.

The second active layer 80 had seven second well layers 81 and six second barrier layers 82. The second active layer 80 further had a sixth barrier layer 83 that was positioned lowest in the second active layer 80, and a third barrier layer 84 that was positioned highest in the second active layer 80. The second well layers 81 were undoped InGaN layers. The In composition ratio of the second well layers 81 was about 15%. The thickness of each second well layer 81 was about 3.5 nm. Each second barrier layer 82 had a first layer 82a and a second layer 82b. The first layers 82a were silicon-doped GaN layers. The second layers 82b were undoped GaN layers. The sixth barrier layer 83 included, successively from the second super lattice layer 70 side, a silicon-doped InGaN layer and a undoped GaN layer. The thickness of the sixth barrier layer 83 was about 3.5 nm. The third barrier layer 84 was an undoped GaN layer. The thickness of the third barrier layer 84 was about 4 nm.

The second p-side nitride semiconductor layer 43 contained magnesium as a p-type impurity. The magnesium concentration of the second p-side nitride semiconductor layer 43 was about $5 \times 10^{20}$ cm$^{-3}$. The magnesium concentration of the second p-side nitride semiconductor layer 43 refers to the highest magnesium concentration in the second p-side nitride semiconductor layer 43. The thickness of the second p-side nitride semiconductor layer 43 was about 100 nm.

Figure 5A:
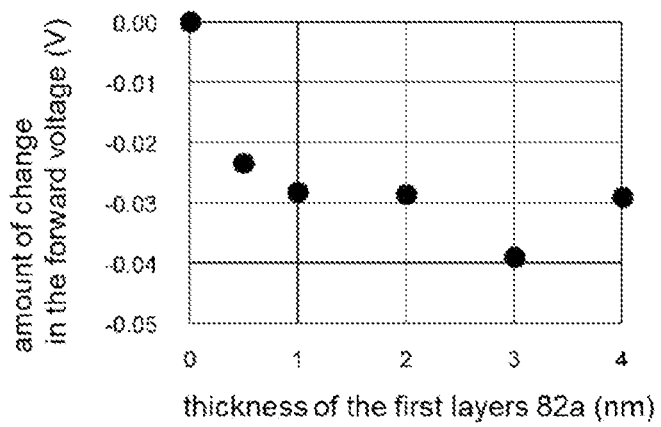
FIG. 5A is a graph showing the forward voltage measurement results of the light emitting elements according to the embodiment.
Figure 5B:
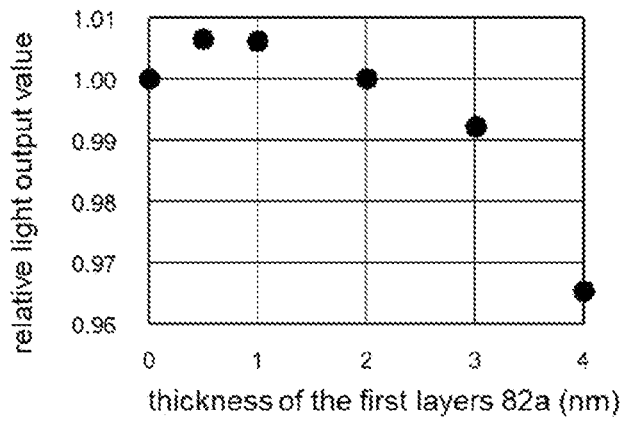
FIG. 5B is a graph showing the light output measurement results of the light emitting elements according to the embodiment.

FIG. 5A is a graph showing the forward voltage measurement results of the light emitting element 1 samples when the forward current applied was 120 mA. The silicon concentration of the first layers 82a in each of the light emitting element 1 samples was about $1 \times 10^{18}$ cm$^{-3}$. In FIG. 5A, the horizontal axis represents the thickness (nm) of the first layers 82a in which the silicon concentration peaks in the respective second barrier layers 82 were located. FIG. 5A and FIG. 5B show the measurement results in cases in which the thickness of the first layers 82a was 0.5 nm, 1 nm, 2 nm, 3 nm, and 4 nm. The thickness of the first layers 82a being zero means that the second barrier layers 82 did not include any first layer 82a, i.e., they were undoped GaN layers. Furthermore, the thickness of the second barrier layers 82 in each sample was 4 nm. The thickness of the first layers 82a being 4 nm means that the second barrier layers 82 were silicon-doped n-type first layers 82a. In FIG. 5A, the vertical axis represents the amount of change in the forward voltage (V) as compared to the forward voltage (0.00 V) assumed in a case in which the thickness of the first layers 82a was zero.

FIG. 5B is a graph showing the light output measurement results of the light emitting element 1 samples when the forward current applied was 120 mA. The silicon concentration of the first layers 82a in each of the light emitting element 1 samples was about $1 \times 10^{18}$ cm$^{-3}$. In FIG. 5B, the horizontal axis represents the thickness (nm) of the first layers 82a in the second barrier layers 82. In FIG. 5B, the vertical axis represents the relative light output value as compared to the light output (1.00) assumed in a case in which the thickness of the first layers 82a was zero.

As shown by the results in FIG. 5A and FIG. 5B, the forward voltage declined in the light emitting element 1 samples according to the embodiment in which the thickness of the first layers 82a was 0.5 nm to 4 nm as compared to a case in which the thickness of the first layers 82a was zero. Furthermore, the samples in which the first layers 82a was 0.5 nm to 2 nm in thickness achieved light outputs equivalent to or higher than a case in which the thickness of the first layers 82a was zero while reducing the forward voltage as compared to a case in which the thickness of the first layers 82a was zero. Accordingly, the preferable thickness range for the first layers 82a in the second barrier layers 82 in achieving an equivalent or higher light output while reducing the forward voltage is 0.5 nm to 2 nm. The more preferable thickness range for the first layers 82a, to further increase the light output while reducing the forward voltage as compared to a case in which the thickness of the first layers 82a is zero, is 0.5 nm to 1 nm.

Figure 6A:
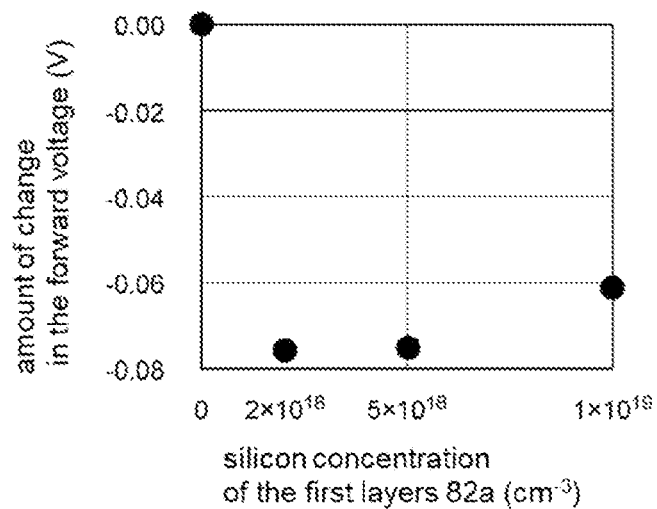
FIG. 6A is a graph showing the forward voltage measurement results of the light emitting elements according to the embodiment.
Figure 6B:
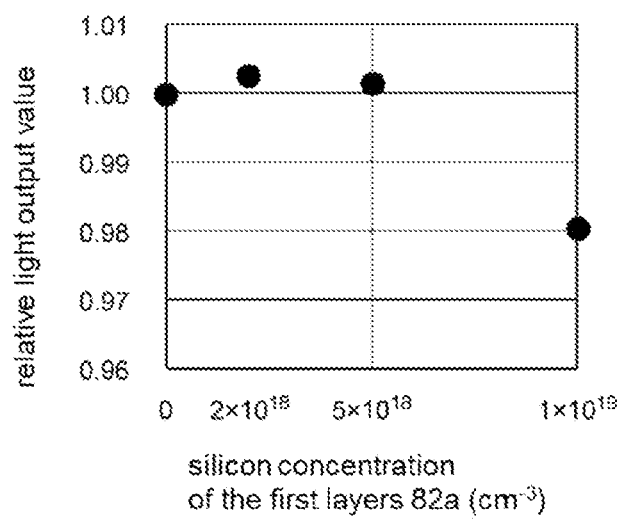
FIG. 6B is a graph showing the light output measurement results of the light emitting elements according to the embodiment.

FIG. 6A is a graph showing the forward voltage measurement results of the light emitting element 1 samples with varied silicon concentrations for the first layers 82a when the forward current applied was 120 mA. The thickness of the second barrier layers 82 in each sample was about 4 nm, and the thickness of the first layers 82a in the second barrier layers 82 was about 0.5 nm. In FIG. 6A, the horizontal axis represents the silicon concentration (cm$^{-3}$) of the first layers 82a. FIG. 6A and FIG. 6B show the measurement results in the cases in which the silicon concentration of the first layers 82a was $2 \times 10^{18}$ cm$^{-3}$, $5 \times 10^{18}$ cm$^{-3}$, and $1 \times 10^{19}$ cm$^{-3}$. The silicon concentration being zero means that the second barrier layers 82 did not include any first layer 82a, i.e., they were undoped GaN layers. In FIG. 6A, the vertical axis represents the amount of change in the forward voltage (V) as compared to the forward voltage (0.00 V) assumed in a case in which the silicon concentration was zero.

FIG. 6B is a graph showing the light output measurement results of the light emitting element 1 samples with varied silicon concentrations for the first layers 82a when the forward current applied was 120 mA. The thickness of the second barrier layers 82 in each sample was about 4 nm, and the thickness of the first layers 82a in the second barrier layers 82 was about 0.5 nm. In FIG. 6B, the horizontal axis represents the silicon concentration (cm$^{-3}$) of the first layers 82a. In FIG. 6B, the vertical axis represents the relative light output value as compared to the light output (1.00) assumed in a case in which the silicon concentration was zero.

As shown by the results in FIG. 6A and FIG. 6B, the forward voltage declined in the light emitting element 1 samples according to the embodiment when the silicon concentration of the first layers 82a was $2 \times 10^{18}$ cm$^{-3}$ to $1 \times 10^{19}$ cm$^{-3}$ as compared to the case of zero silicon concentration. Furthermore, the samples in which the silicon concentration of the first layers 82a was $2 \times 10^{18}$ cm$^{-3}$ to $5 \times 10^{18}$ cm$^{-3}$ achieved light outputs equivalent to or higher than that in the case of zero silicon concentration while reducing the forward voltage as compared to case of zero silicon concentration. Accordingly, the preferable silicon concentration range for the first layers 82a is $2 \times 10^{18}$ cm$^{-3}$ to $5 \times 10^{18}$ cm$^{-3}$.

Figure 4:
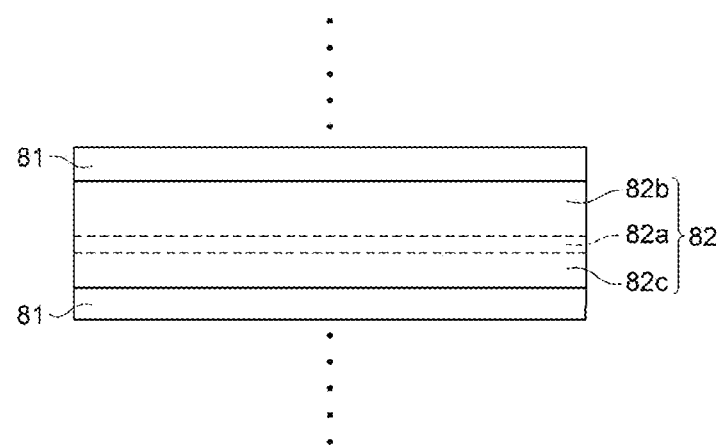
FIG. 4 is a cross-sectional view of a portion of a second active layer in a variation of the embodiment.

As shown in FIG. 4, each second barrier layer 82 can further have a third layer 82c that is positioned closer to the first light emitting part 21 than the first layer 82a is. FIG. 4 is a cross-sectional view of a portion of the second active layer 80 according to a variation of the embodiment. FIG. 4 shows two adjacent second well layers 81 and a second barrier layer 82 positioned between the second well layers 81.

A second barrier layer 82 can be formed by forming a second well layer 81, followed by forming a third layer 82c on the second well layer 81, forming a first layer 82a on the third layer 82c, and forming a second layer 82b on the first layer 82a. For example, a second barrier layer 82 is formed by forming an undoped GaN layer as a third layer 82c, forming an n-type GaN layer as a first layer 82a on the third layer 82c, and forming an undoped GaN layer as a second layer 82b on the first layer 82a. Providing such a third layer 82c can further improve the crystalline quality of the first layer 82a as well as the crystalline quality of the second well layer 81 positioned above the first layer 82a as compared to the case in which the first layer 82a is formed in contact with the second swell layer 81 formed thereunder.

The n-type impurity concentration of the second layer 82b and the n-type impurity concentration of the third layer 82c are lower than the n-type impurity concentration of the first layer 82a. This can further improve the crystalline quality of the first layer 82a. The third layer 82c is thinner than the second layer 82b. The thickness of the third layer 82c can be set in a range of 0.1 nm to 1 nm.

In the foregoing, certain embodiments of the present disclosure have been explained with reference to specific examples. The present invention, however, is not limited to these specific examples. All forms implementable by a person skilled in the art by suitably making design changes based on any of the embodiments of the present disclosure described above also fall within the scope of the present invention so long as they encompass the subject matter of the present invention. Furthermore, various modifications and alterations within the spirit of the present disclosure that could have been made by a person skilled in the art also fall within the scope of the present invention.

What is claimed is:

1. A light emitting element comprising:
   successively from a lower side to an upper side:
      a first light emitting part having a first active layer;
      a tunnel junction part; and
      a second light emitting part having a second active layer; wherein:
   the first active layer comprises:
      a plurality of first well layers, and
      a first barrier layer positioned between two adjacent first well layers among the first well layers and having a wider band gap than the band gaps of the first well layers;
   the second active layer comprises:
      a plurality of second well layers, and
      a second barrier layer positioned between two adjacent second well layers among the second well layers and having a wider band gap than the band gaps of the second well layers;
   the second barrier layer is a nitride semiconductor layer containing an n-type impurity and gallium, and has a higher n-type impurity concentration than an n-type impurity concentration of the first barrier layer;
   the second barrier layer comprises, successively from a first light emitting part side, a first layer and a second layer;
   an n-type impurity concentration peak in the second barrier layer is located in the first layer; and
   a thickness of the first layer is 10% to 50% of a thickness of the second barrier layer.

2. The light emitting element according to claim 1, wherein:
   the thickness of the first layer is in a range of 0.5 nm to 2 nm.

3. The light emitting element according to claim 1, wherein:
   the tunnel junction part comprises a nitride semiconductor layer containing an n-type impurity; and
   an n-type impurity concentration of the first layer is lower than an n-type impurity concentration of the tunnel junction part.

4. The light emitting element according to claim 2, wherein:
   the tunnel junction part comprises a nitride semiconductor layer containing an n-type impurity; and
   an n-type impurity concentration of the first layer is lower than an n-type impurity concentration of the tunnel junction part.

5. The light emitting element according to claim 1, wherein:
   an n-type impurity concentration of the first layer is in a range of $2\times10^{18}$ cm$^{-3}$ to $5\times10^{18}$ cm$^{-3}$.

6. The light emitting element according to claim 2, wherein:
   an n-type impurity concentration of the first layer is in a range of $2\times10^{18}$ cm$^{-3}$ to $5\times10^{18}$ cm$^{-3}$.

7. The light emitting element according to claim 3, wherein:
   the n-type impurity concentration of the first layer is in a range of $2\times10^{18}$ cm$^{-3}$ to $5\times10^{18}$ cm$^{-3}$.

8. The light emitting element according to claim 1, wherein:
   the second barrier layer further comprises a third layer that is positioned closer to the first light emitting part than is the first layer; and
   an n-type impurity concentration of the second layer and an n-type impurity concentration of the third layer are lower than an n-type impurity concentration of the first layer.

9. The light emitting element according to claim 2, wherein:
   the second barrier layer further comprises a third layer that is positioned closer to the first light emitting part than is the first layer; and
   an n-type impurity concentration of the second layer and an n-type impurity concentration of the third layer are lower than an n-type impurity concentration of the first layer.

10. The light emitting element according to claim 3, wherein:
    the second barrier layer further has a third layer that is positioned closer to the first light emitting part than the first layer; and
    an n-type impurity concentration of the second layer and an n-type impurity concentration of the third layer are lower than the n-type impurity concentration of the first layer.

11. The light emitting element according to claim 1, wherein:
    the second active layer comprises three or more second well layers and two or more second barrier layers; and
    an n-type impurity concentration peak in each of the second barrier layers is located on the first light emitting part side.

12. The light emitting element according to claim 2, wherein:
    the second active layer comprises three or more second well layers and two or more second barrier layers; and
    an n-type impurity concentration peak in each of the second barrier layers is located on the first light emitting part side.

13. The light emitting element according to claim 1, wherein:
    the second active layer further comprises a third barrier layer at a highest position in the second active layer; and
    an n-type impurity concentration of the third barrier layer is lower than the n-type impurity concentration of the second barrier layer.

14. The light emitting element according to claim 2, wherein:
    the second active layer further comprises a third barrier layer at a highest position in the second active layer; and
    an n-type impurity concentration of the third barrier layer is lower than the n-type impurity concentration of the second barrier layer.

* * * * *